(12) United States Patent
Baan et al.

(10) Patent No.: US 6,310,685 B1
(45) Date of Patent: Oct. 30, 2001

(54) APPARATUS AND METHOD FOR HOLDING A GREEN SHEET AND SYSTEM AND METHOD FOR INSPECTING A GREEN SHEET

(75) Inventors: Robert L. Baan, Wallkill; James O. Goring, Staatsburg; David Scott Graboski, Wappingers Falls; John R. Lankard, Jr., Poughkeepsie; Kurt R. Muller; Raymond H. Turcotte, both of Hopewell Junction, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/357,506

(22) Filed: Jul. 20, 1999

(51) Int. Cl.[7] ............................. G01N 21/01; G01N 21/88
(52) U.S. Cl. ....................................... 356/244; 356/237.2
(58) Field of Search ................................ 356/244, 237.1, 356/237.2, 237.3, 237.4, 237.5

(56) References Cited

U.S. PATENT DOCUMENTS

| | | | |
|---|---|---|---|
| 4,621,232 | * 11/1986 | Chang et al. ........................ | 324/751 |
| 5,141,212 | 8/1992 | Beeding . | |
| 5,379,691 | 1/1995 | Hamu et al. . | |
| 5,582,104 | 12/1996 | Best et al. . | |
| 5,667,636 | 9/1997 | Engel et al. . | |
| 5,800,661 | 9/1998 | Reis et al. . | |
| 5,819,651 | 10/1998 | Zepic et al. . | |
| 5,822,038 | 10/1998 | Slater et al. . | |
| 5,831,857 | 11/1998 | Clarino et al. . | |

FOREIGN PATENT DOCUMENTS 10-65345 * 3/1998 (JP) .

* cited by examiner

Primary Examiner—Richard A. Rosenberger
(74) Attorney, Agent, or Firm—Schmeiser, Olsen & Watts; Steven Capella

(57) ABSTRACT

A green sheet holding apparatus includes a first member secured to a first edge of the green sheet and a second member moveable relative to the first member, the second member being secured to a second edge of the green sheet. A forcing mechanism, connected to the second member and to the first member, forces the second member away from the first member such that the first edge and the second edge of the green sheet are forced away from each other and the green sheet is flattened. The holding apparatus may be included in a green sheet inspection system, wherein the inspection system further includes a light source directing a light onto the green sheet and a camera detecting light from the green sheet. The invention also includes a method of holding a green sheet, which includes securing the first edge of the green sheet to a first member, securing the second edge of the green sheet to a second member, and forcing the second member away from the first member. This method pulls the first edge and the second edge of the green sheet outwardly, thereby flattening the green sheet. The method may be part of a method of inspecting a screened pattern on a green sheet, which further includes directing a light onto a the green sheet and detecting the light as it emerges from the green sheet.

37 Claims, 7 Drawing Sheets

APPARATUS AND METHOD FOR HOLDING A GREEN SHEET AND SYSTEM AND METHOD FOR INSPECTING A GREEN SHEET

BACKGROUND OF THE INVENTION

1. Technical Field

This invention generally relates to a system and method for inspecting a sheet, and more specifically relates to a system and method for inspecting a pattern on a green sheet.

2. Background Art

Chip carriers typically include several layered sheets, and each sheet includes a ceramic having a pattern formed thereon. In one example, the ceramic is silicate and the pattern material is molybdenum. A method of forming such a sheet typically includes forming the silicate; applying, or screening, a molybdenum paste to the silicate, thereby forming the pattern on the silicate; and allowing the sheet to cure. Before the sheet cures, it is typically called a green sheet.

The pattern is often formed on only one side of the sheet. However, the ceramic often includes holes punched therein with the pattern material filling the punched holes. In this way, when the chip carrier is formed, the pattern on one sheet is connected to the pattern on another sheet via the pattern material in one or more punched holes extending between the patterns.

Patterns formed on green sheets sometimes have flaws. For example, the pattern may include a gap, or it may be smeared. Accordingly, after applying the pattern to the green sheet, it is often desirable to inspect the pattern. In fact, the pattern may be inspected several times during the process of applying it. In prior inspection systems, the green sheet was supported on a wire mesh while the pattern was inspected. However, the wire mesh support was problematic because it often damaged the green sheet, such as by smearing the pattern.

DISCLOSURE OF INVENTION

Accordingly, there is a need for a green sheet holding apparatus that will hold a green sheet without harming it, but that will produce sufficient flatness in the green sheet so that it can be inspected. The present invention includes a green sheet holding apparatus for holding a green sheet having a first edge and an opposing second edge. The holding apparatus includes a first member secured to the first edge of the green sheet, and a second member that is secured to the second edge of the green sheet and is moveable relative to the first member. A forcing mechanism connected to the first and second members forces the second member away from the first member such that the first edge and the second edge of the green sheet are forced away from each other and the green sheet is flattened.

In one embodiment, the forcing mechanism includes a housing secured to the first member and a lever arm that forces the second member relative to the housing. The forcing mechanism may also include a cam member rotatably connected to the housing, wherein the cam member has a cam surface connected to the second member such that rotation of the cam member forces the second member away from the first member.

The first member and the second member may each include a porous surface for securing the first edge of the green sheet to the first member and the second edge of the green sheet to the second member. In this embodiment, each porous surface is fluidly connected to a vacuum source, and the first edge of the green sheet is in contact with the porous surface on the first member and the second edge of the green sheet is in contact with the porous surface on the second member. The pressure differential created by the vacuum source secures the first edge of the green sheet to the first member and secures the second edge of the green sheet to the second member.

The green sheet may also include a third edge secured to a third member and an opposing fourth edge secured to a fourth member. In this embodiment, the fourth member is moveable relative to the third member, and the forcing mechanism forces the fourth member away from the third member, such that the third edge and the fourth edge of the green sheet are forced away from each other and the green sheet is further flattened.

The holding apparatus may be included in a green sheet inspection system, wherein the inspection system further includes a light source directing a light onto the green sheet and a camera detecting light from the green sheet.

The invention also includes a method of holding a green sheet, which includes securing the first edge of the green sheet to a first member, securing the second edge of the green sheet to a second member, and forcing the second member away from the first member. This method pulls the first edge and the second edge of the green sheet outwardly, thereby flattening the green sheet. The method may also include securing a third edge of the green sheet to a third member, securing a fourth edge of the green sheet to a fourth member, and forcing the fourth member away from the third member to further flatten the green sheet. Moreover, the method may be part of a method of inspecting a screened pattern on a green sheet, which further includes directing a light onto the green sheet and detecting the light as it emerges from or is reflected from the green sheet.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements.

BEST MODE FOR CARRYING OUT THE INVENTION

Figure 1:
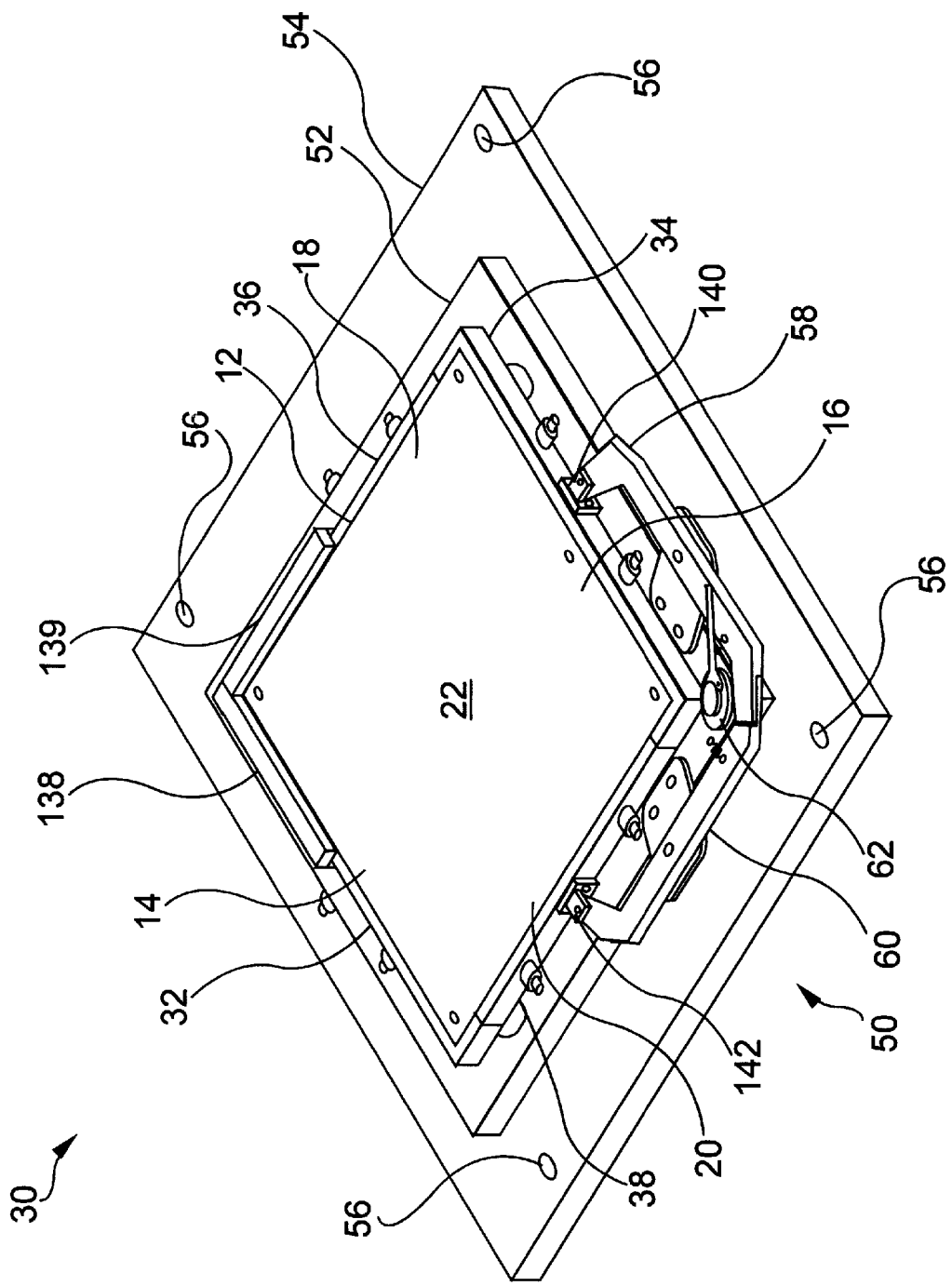
FIG. 1 is a perspective view of a green sheet holding apparatus according to the present invention, wherein the apparatus is holding a green sheet.

Referring to FIG. 1, a green sheet 12 includes a first edge 14, an opposing second edge 16, a third edge 18, and an opposing fourth edge 20. Green sheet 12 also has a first side 22, and an opposing second side 24 (see FIGS. 4–5). A holding apparatus 30 for holding green sheet 12 includes a first member 32, secured to first edge 14 of green sheet 12, and a second member 34, secured to second edge 16 of green sheet 12, that is moveable relative to first member 32. Apparatus 30 preferably also includes a third member 36, secured to third edge 18 of green sheet 12, and a fourth member 38, secured to fourth edge 20 of green sheet 12, that is moveable relative to third member 36. However, those of skill in the art will recognize that the present invention will also produce advantageous results with two members, and furthermore, that the present invention will produce advantageous results with more than four members if the green sheet has more than four edges.

Apparatus 30 preferably also includes a forcing mechanism 50 that is connected to first member 32, second member 34, third member 36, and fourth member 38. In the embodiment shown in FIG. 1, the forcing mechanism includes a housing 52 mounted on a plate 54, and is preferably secured thereon by bolts or other fasteners (not shown). Plate 54 defines holes 56 that are adapted to receive bolts or screws for securing plate 54 to the overall inspection system. Housing 52 is secured to third member 36 and first member 32. A first lever arm 58 is connected to second member 34, a second lever arm 60 is connected to fourth member 38, and a cam member 62 is pivotally connected to housing 52 so that rotation of cam member 62 pivots first lever arm 58 and second lever arm 60.

A method of holding green sheet 12 includes securing first edge 14 of green sheet 12 to first member 32, securing second edge 16 of green sheet 12 to second member 34, and forcing second member 34 away from first member 32. This method pulls first edge 14 and second edge 16 of green sheet 12 outwardly, thereby flattening green sheet 12. Preferably, the method also includes securing third edge 18 of green sheet 12 to third member 36, securing fourth edge 20 of green sheet 12 to fourth member 38, and forcing fourth member 38 away from third member 36 to further flatten the green sheet. Moreover, the method may be part of a method of inspecting a screened pattern on green sheet 12, which further includes directing a light onto green sheet 12 and detecting the light as it emerges from or is reflected from green sheet 12.

Figure 2:
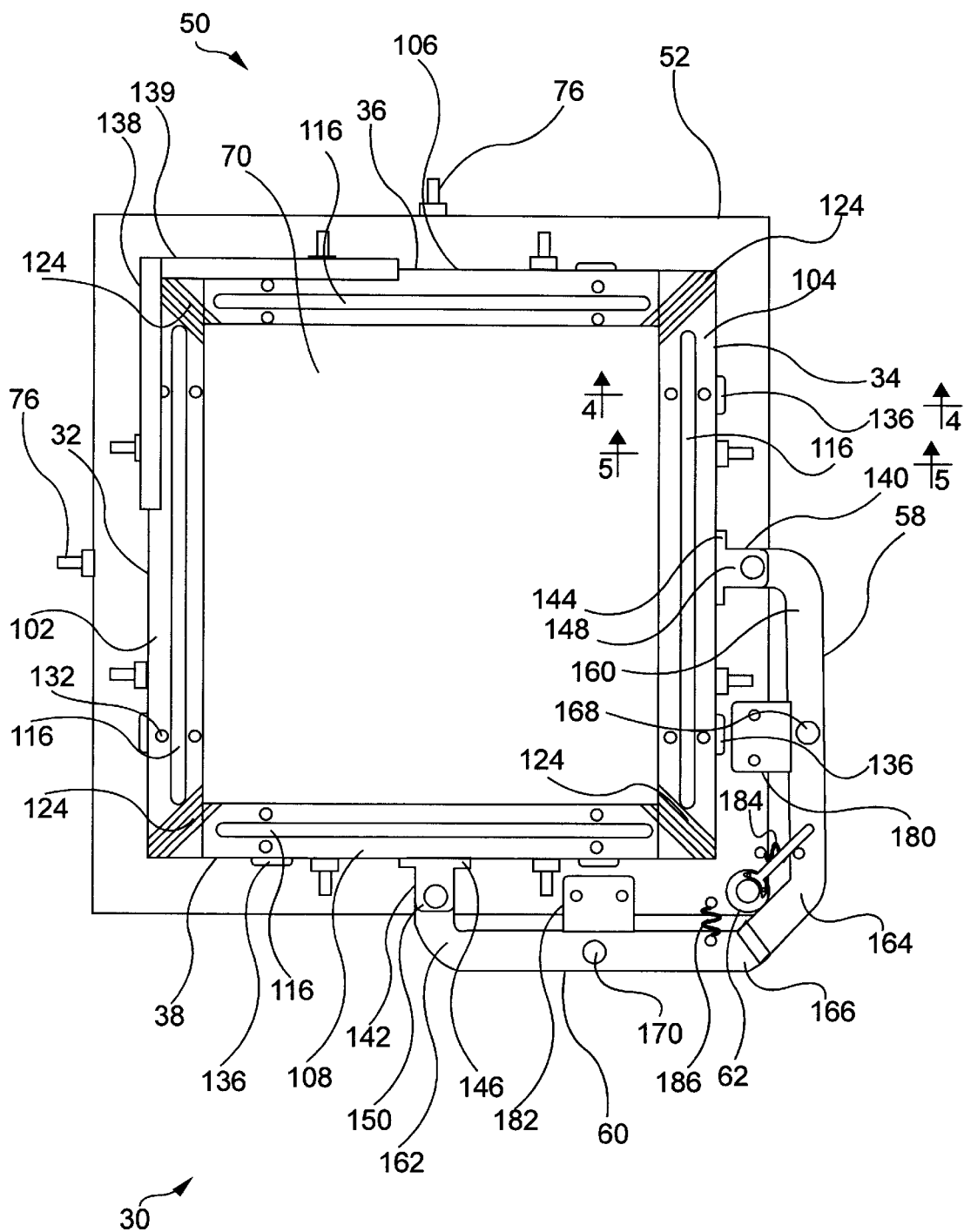
FIG. 2 is a top plan view of the holding apparatus of FIG. 1, but the apparatus is not holding a green sheet.
Figure 3:
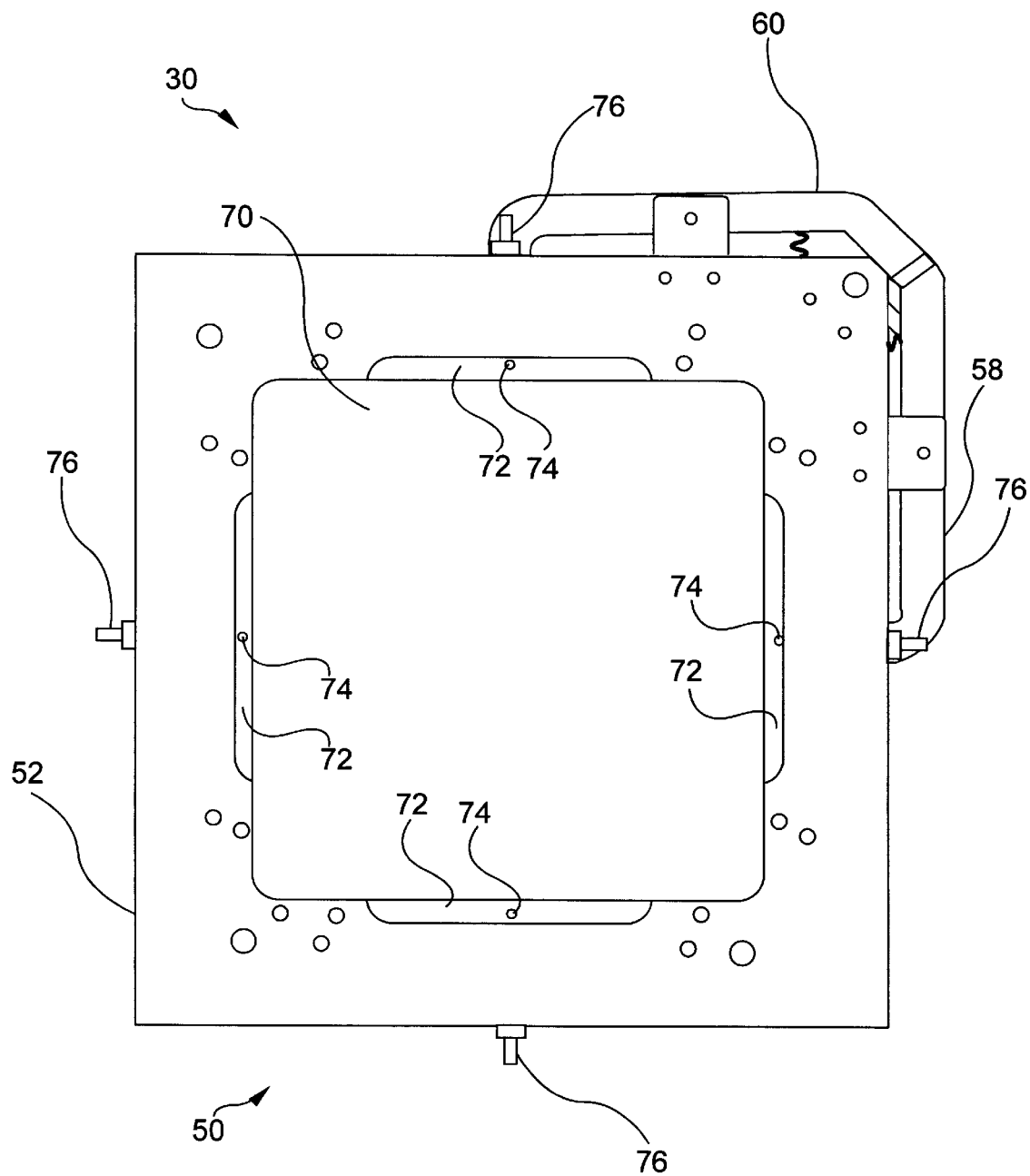
FIG. 3 is a bottom plan view of the holding apparatus of FIG. 2.

Referring to FIGS. 2–3, and describing apparatus 30 in more detail, in a preferred embodiment, housing 52 is a rectangular plate defining a centrally located rectangular aperture 70. Referring to FIG. 3, housing 52 also defines an entry vent 72 on each side of aperture 70 that opens into aperture 70. Housing 52 also defines ducts 74 that fluidly connect entry vents 72 to nipples 76. Nipples 76 are fluidly connected to a source (not shown) of pressurized gas, such as pressurized air. Preferably entry vents 72 are elongate so that gas entering aperture 70 through vents 72 is dispersed.

Referring now to FIG. 2, first member 32, second member 34, third member 36, and fourth member 38 each includes a bar 102, 104, 106, 108, respectively. Bars 102, 104 extend substantially parallel to each other along opposing sides of aperture 70, and bars 106, 108 extend substantially parallel to each other, and substantially normal to bars 102, 104, along opposing sides of aperture 70.

Figure 5:
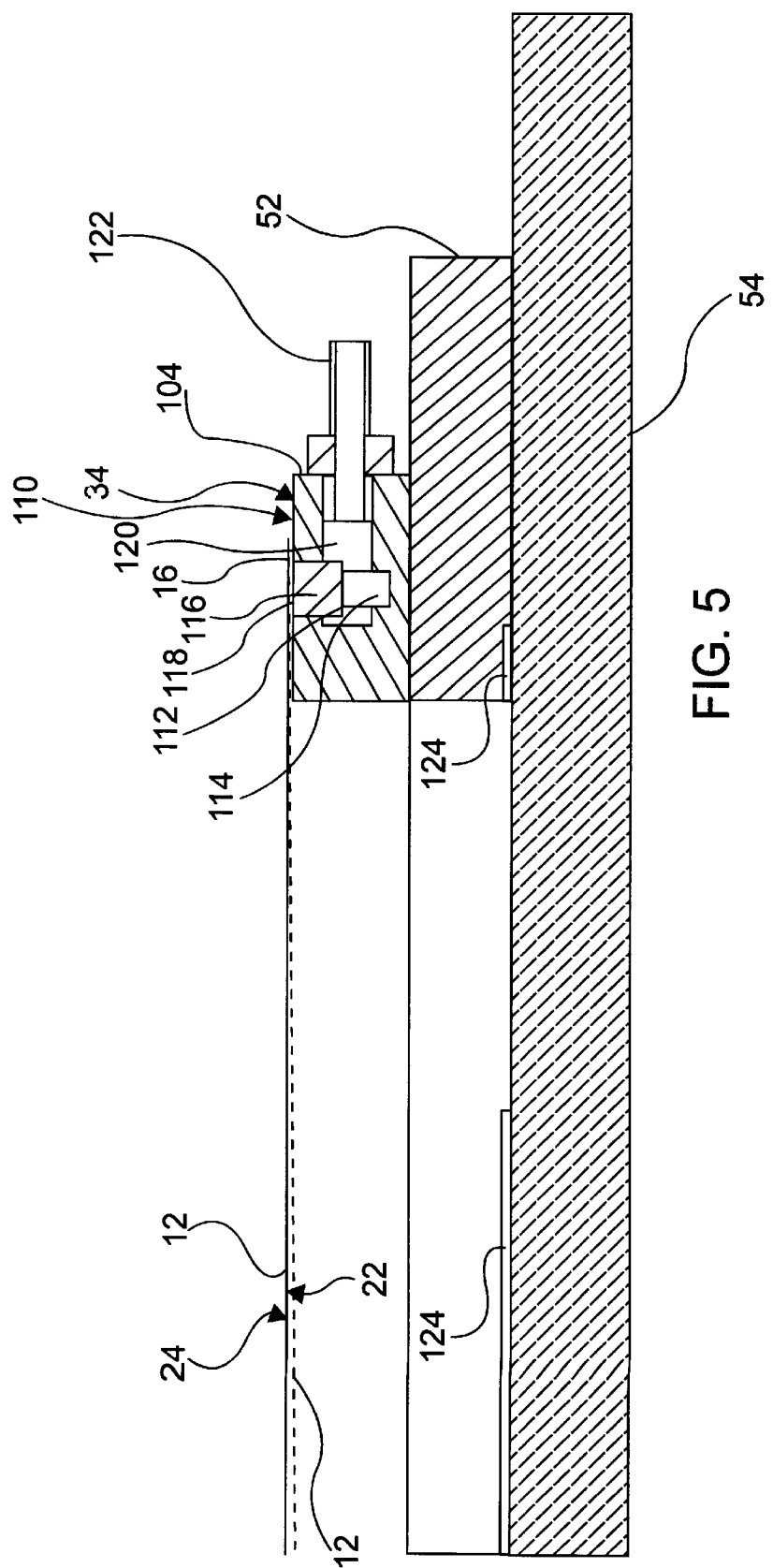
FIG. 5 is An enlarged sectional view taken along line 5—5 of FIG. 2.

Referring now to FIG. 5, each bar 102, 104, 106, 108 defines a longitudinal insert channel 112 extending downwardly from an upper surface 110, and a narrower, deeper longitudinal duct channel 114. Each duct channel 114 is aligned with insert channel 112 and extends below the floor of insert channel 112. Each insert channel 112 receives a porous insert 116, having an exposed porous surface 118. All porous surfaces 118 lie substantially within the same plane. Preferably, this plane is horizontal with each porous surface facing upwardly. Each duct channel 114 intersects two vacuum ducts 120, and each vacuum duct 120 receives a vacuum nipple 122 that is connected to a vacuum source. Thus, porous surface 118 is fluidly connected to the vacuum source via porous insert 116, duct channel 114, vacuum ducts 120, and vacuum nipples 122.

A first side 22 of second edge 16 of green sheet 12 contacts porous surface 118 on second member 34, thereby creating a pressure differential between first side 22 and second side 24 of second edge 16. The pressure differential secures second edge 16 of green sheet 12 to second member 34. Likewise, first side 22 of first edge 14 contacts porous surface 118 on first member 32, first side 22 of third edge 18 contacts porous surface 118 on third member 34, and first side 22 of fourth edge 20 contacts porous surface 118 on fourth member 34.

Referring back to FIG. 2, each member 32, 34, 36, 38 defines exit vents 124. In a preferred embodiment, the exit vents 124 are grooves extending across the upper surface 110 of each bar 102, 104, 106, 108 beyond the terminus of each insert channel 112.

Those skilled in the art will recognize that the present invention will provide beneficial results with any of various other mechanisms for securing an edge of a sheet to a member. For example, each member could include a mechanical clamp for securing each edge of the green sheet to a member, rather than a porous surface connected to a vacuum source for securing each edge of the green sheet to a member.

Figure 4:
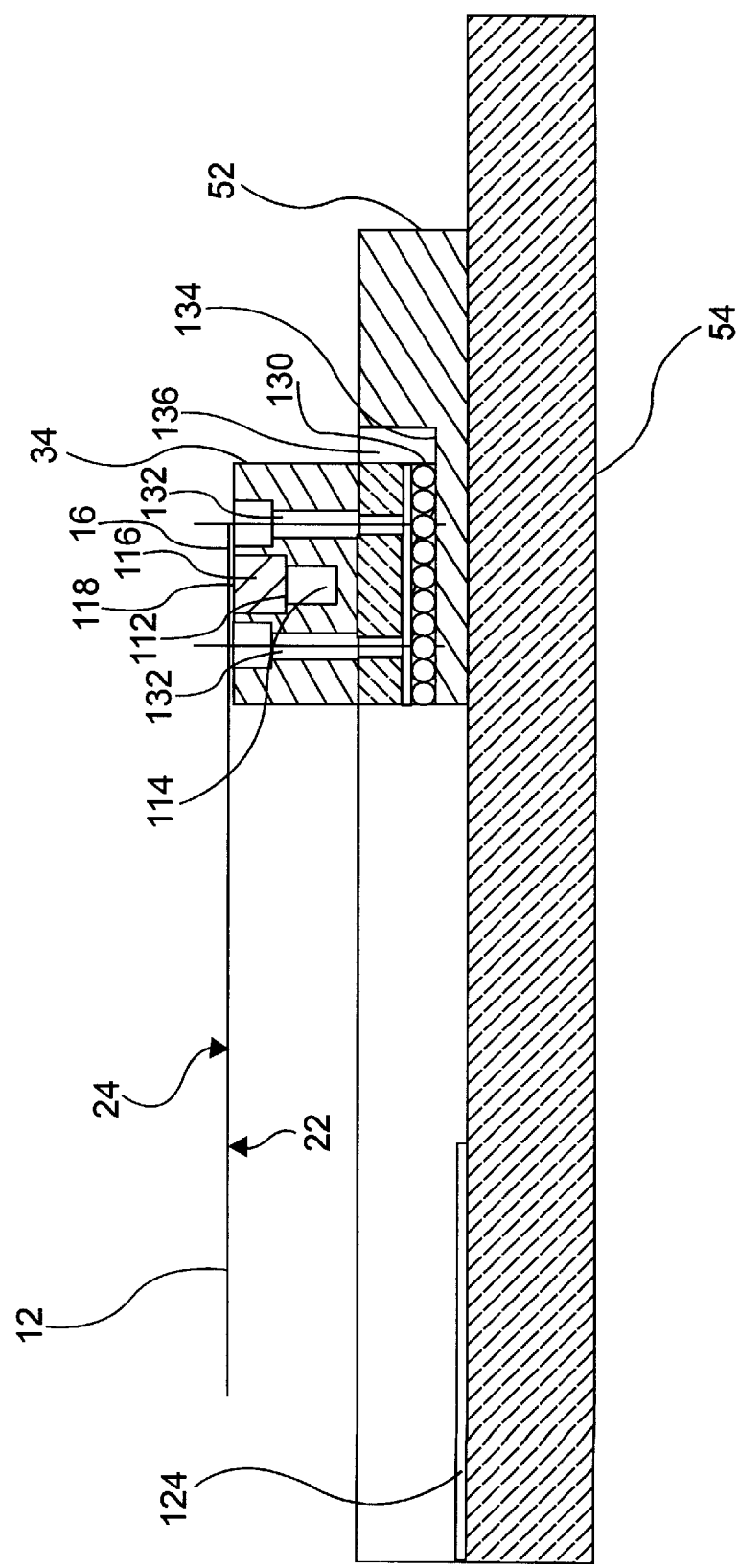
FIG. 4 is an enlarged sectional view taken along line 4—4 of FIG. 2.

Referring to FIG. 4, second member 34 and fourth member 38 are each supported by two linear bearings 130 (only one of which is shown in FIG. 4). In a preferred embodiment, second member 34 and fourth member 38 are secured to linear bearings 130 by bolts or screws extending through bolt holes 132 defined by second member 34 and fourth member 38. Each linear bearing 130 is supported by the floor 134 of a channel 136 defined by housing 52. Thus, second member 34 and fourth member 38 are moveable relative to housing 52.

Referring back to FIG. 2, third member 36 and first member 32 are secured to housing 52 by bolts extending through holes 132 defined by third member 36 and first member 32. Angle locators 138, 139 for positioning green sheet 12 on holding apparatus 30 extend along upper surface 110 of bars 102, 106, forming a right angle therebetween. Angle locators 138, 139 are preferably angle iron secured to bars 102, 106, wherein one leg of the angle extends downwardly from the outer edge of upper surface 110 of each bar 102, 106 and the other leg extends inwardly along the upper surface. However, the angle locators could be some other shape, and they could be formed as a continual portion of bars 102, 106.

L-shaped brackets 140, 142 each have a base 144, 146 and a leg 148, 150. Base 144 of bracket 140 is secured to second member 34, and base 146 of bracket 142 is secured to fourth member 38. Leg 148 of bracket 140 is pivotally connected to a first end 160 of first lever arm 58, and leg 150 of bracket 142 is pivotally connected to a first end 162 of second lever arm 60. The pivotal connection may be a pin joint or some other fastening mechanism known in the art that creates a pivotal connection. Preferably, the joint allows the first end 160, 162 of each lever arm 58, 60 to slide relative to the corresponding bracket 140, 142, thereby allowing each member 34, 38 to follow a linear path while each end 160, 162 follows a circular path.

First lever arm 58 and second lever arm 60 each have a second end 164, 166, and a pivot 168, 170 intermediate the first end 160, 162 and the second end 164, 166. Pivots 168, 170 connect first lever arm 58 and second lever arm 60 to plate brackets 180, 182. Preferably, pivots 168, 170 are pins, bolts, or screws. However, they may be any of various fasteners that form pivotal joints between members. Plate brackets 180, 182 are secured to housing 52, preferably by fasteners such as screws or bolts. Second ends 164, 166 of first lever arm 58 and second lever arm 60 narrow to form overlapping tabs (see FIG. 1). Thus, second end 164 of first lever arm 58 overlaps second end 166 of second lever arm 60.

Figure 6:
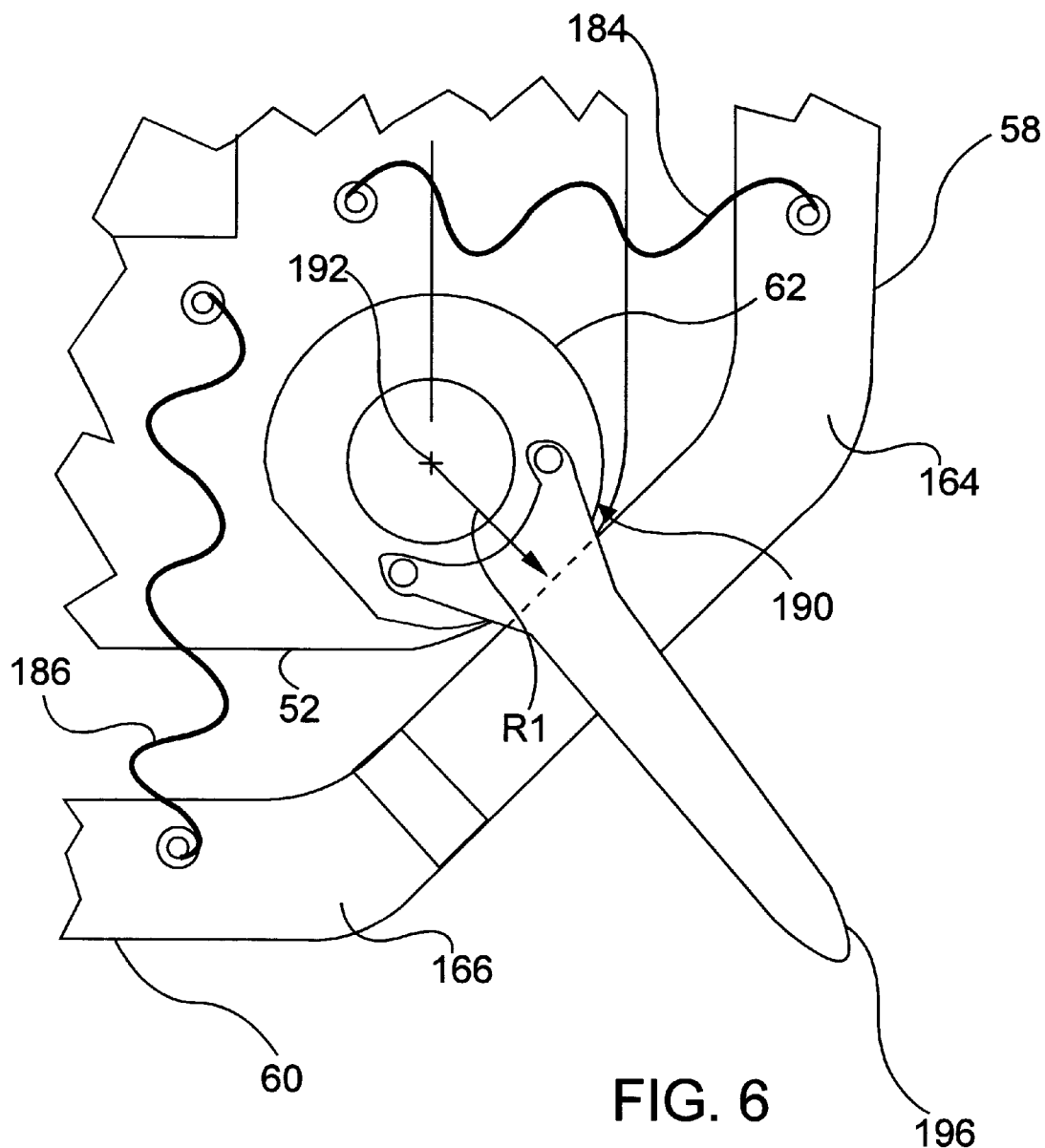
FIG. 6 is an enlarged top plan view of the portion of the holding apparatus of FIG. 1 surrounding the cam member, with the cam member in the high position.

Referring to FIG. 6, tension spring or biasing member 184 extends between housing 52 and first lever arm 58. Tension spring or biasing member 186 extends between housing 52 and second lever arm 60. Preferably, opposing ends of each spring 184, 186 receive pins or other fasteners that secure the opposing ends to housing 52 and lever arms 58, 60. Springs 184, 186 bias second ends 164, 166 toward the center of housing 52. Accordingly, springs 184, 186 bias first ends 160, 162 outwardly, thereby biasing second member 34 away from first member 32 and biasing fourth member 38 away from third member 36.

Cam member 62 is pivotally connected to housing 52. The pivotal connection may be a shoulder screw that extends through a central hole in cam member 62. Alternatively, other types of pivotal connections may be used. Cam member 62 defines a camming surface 190 that abuts second ends 164, 166 of first lever arm 58 and second lever arm 60, opposing the biasing force of springs 184, 186. Camming surface 190 is substantially cylindrical and is centered around a pivot point 192, having a radius R1. However, one segment of camming surface 190 slopes inwardly to an innermost point 194 that is a distance R2 from pivot point 192 (see FIG. 7).

A handle 196 is coupled to, and extends radially from, cam member 62. In a preferred embodiment, handle 196 is secured to cam member 62 by bolts or screws. However, handle 196 may be coupled to cam member 62 by any of various well known fasteners. A spacer (not shown) may be placed intermediate cam member 62 and handle 196 to make handle 196 more accessible and to prevent handle 196 from interfering with adjacent parts of holding apparatus 30.

In an alternative embodiment (not shown), the first member, second member, third member, and fourth member are all moveable relative to the housing. In this embodiment, the apparatus further includes a third lever arm that forces the first member away from the second member and a fourth lever arm that forces the third member away from the fourth member.

In addition to holding apparatus 30 described above, an inspection system may also include an inspection tool having a light source for directing light onto green sheet 12, a camera for detecting light as it emerges from green sheet 12, and a computer for processing information from the camera. In a preferred embodiment, the inspection tool is the inspection tool available from Midas Vision Systems, Inc., located in Wrentham, Mass. having model number 836-I1. In one embodiment, the light is positioned on one side of green sheet 12 and the camera is positioned on the other side of green sheet 12 so that the camera detects light that has passed through green sheet 12. Alternatively, the light source may be positioned on the same side of green sheet 12 as the camera so that the camera detects light that has been reflected from green sheet 12.

A method of holding green sheet 12 using apparatus 30 will now be described. Cam member 62 is rotated using handle 196 so that cam member 62 is in the high position shown in FIG. 6, wherein a portion of camming surface 190 having radius R1 abuts second ends 164, 166 of first lever arm 58 and second lever arm 60. Entry vents 72 are fluidly connected to a pressurized fluid source so that fluid, such as gas blows out of exit vents 72 and into aperture 70.

Green sheet 12 is then positioned so that first edge 14, second edge 16, third edge 18, and fourth edge 20 of green sheet 12 rest on first member 32, second member 34, third member 36, and fourth member 38, respectively. In this position, green sheet 12 spans aperture 70 so that holding apparatus 30 does not touch a central portion of green sheet 12, which has the pattern formed thereon. More specifically, green sheet 12 is positioned so that first edge 14 and third edge 18 abut angle locators 138, 139, respectively.

While green sheet 12 is being positioned, gas flows from entry vents 72 into aperture 70 below green sheet 12, and through exit vents 124. Exit vents 124 limit the flow of gas so that a limited pressure is created beneath green sheet 12 within aperture 70, preventing green sheet 12 from sagging significantly between first member 32, second member 34, third member 36, and fourth member 38. In this way, green sheet 12 may be positioned without touching its central portion where the pattern is formed. Entry vents 72 disperse the gas flow so that the pressure will be distributed substantially evenly beneath green sheet 12. However, the pressure does not sufficiently flatten green sheet 12 for inspection because the gas passing beneath green sheet 12 creates waves in green sheet 12.

Once green sheet 12 is positioned, porous surface 118 of first member 32 and porous surface 118 of third member 36 are fluidly connected to a vacuum source. Because first edge 14 and third edge 18 are in contact with porous surface 118 of first member 32 and porous surface 118 of third member 36, a pressure differential is created between first side 22 of first edge 14 and second side 24 of first edge 14, and a pressure differential is created between first side 22 of third edge 18 and second side 24 of third edge 18, thereby securing first edge 14 to first member 32 and securing third edge 18 to third member 36. Second edge 16 is then secured to second member 34 and fourth edge 20 is secured to fourth member 38 in the same manner. When green sheet 12 is initially secured, it will not be sufficiently flattened (see green sheet 12 in dashed lines in FIG. 5).

Figure 7:
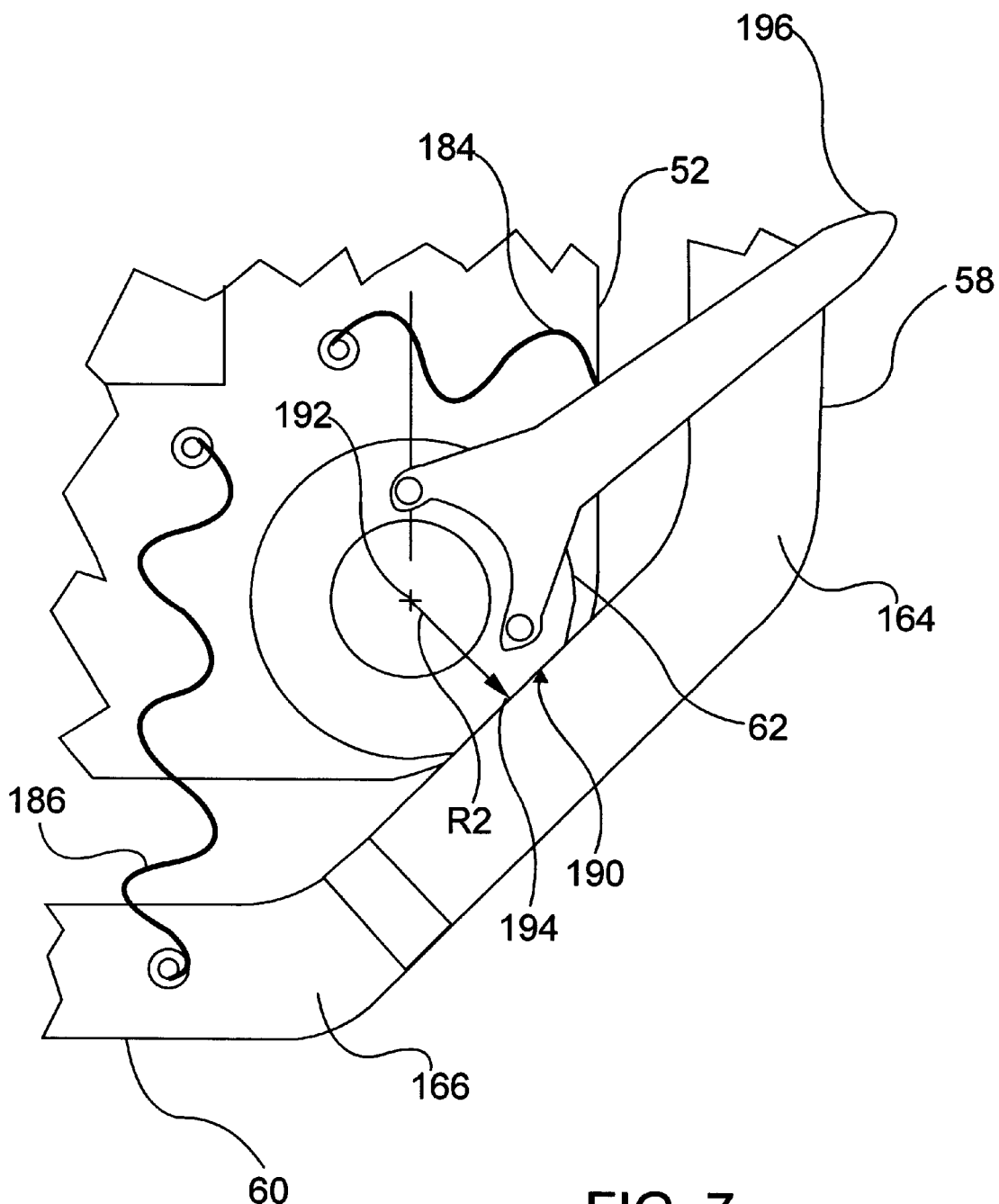
FIG. 7 is a view similar to FIG. 6, but with the cam member in the low position.

Handle 196 is then pivoted so that cam member 62 goes to a low position shown in FIG. 7, wherein the innermost point 194 of the camming surface 190 abuts second end 164 of first lever arm 58 and second end 166 of second lever arm 60. When cam member 62 goes into the low position, camming surface 190 allows spring 184 to pull second end 164 of first lever arm 58 toward the center of housing 52 so that first lever arm 58 pivots and first end 160 of first lever arm 58 pulls second member 34 away from first member 32. Moreover, when cam member 62 goes into the low position, camming surface 190 allows spring 186 to pull second end 166 of second lever arm 60 toward the center of housing 52 so that second lever arm 60 pivots and first end 162 of second lever arm 60 pulls fourth member 38 away from third member 36.

Accordingly, when cam member 62 is in the low position, apparatus 30 creates tension within green sheet 12, thereby flattening green sheet 12 (see green sheet 12 in solid lines in FIG. 5). Preferably, the tension created within green sheet 12 is great enough to sufficiently flatten green sheet 12, but is not so great as to deform or break green sheet 12. The flatness of green sheet 12 should be less than about 0.007 inch, and preferably the flatness is less than about 0.005 inch. The tension in green sheet 12 along a first direction created by moving second member 34 relative to first member 32 should be from about 2.3 mega-Pascals to about 3.5 mega-Pascals. Preferably, the tension in green sheet 12 along a second direction created by moving second member 34 relative to first member 32 is about 3.3 mega-Pascals. The tension in green sheet 12 created by moving fourth member 38 relative to third member 36 should also be from about 2.3 mega-Pascals to about 3.5 mega-Pascals and the tension in green sheet 12 created by moving fourth member 38 relative to third member 36 is preferably about 3.3 mega-Pascals.

In an inspection system, the method of inspecting further includes directing light from a light source onto green sheet 12 and detecting light emerging from the green sheet with a camera. Information representing the detected light is then sent to a computer that has been programmed with a desired pattern. The computer compares the desired pattern with the detection information to determine whether the pattern on green sheet 12 matches the desired pattern within selected tolerances. If the pattern on green sheet 12 does not match the desired pattern within selected tolerances, then the pattern on green sheet 12 is defective, and if the pattern on green sheet 12 does match the desired pattern then the pattern on green sheet 12 is not defective.

In releasing green sheet 12 from holding apparatus 30, cam member 62 is rotated to the high position, as shown in FIG. 6, thereby relieving the tension in green sheet 12. Each porous surface 118 is then fluidly disconnected from the vacuum source, thereby releasing each edge 14, 16, 18, 20 of green sheet 12 from holding apparatus 30.

While the invention has been particularly shown and described with reference to preferred embodiments thereof, it will be understood by those skilled in the art that various changes in form and details may be made therein without departing from the spirit and scope of the invention. For example, although the forcing mechanism has been described herein in detail, those skilled in the art will recognize that the forcing mechanism may operate in any of several ways without departing from the present invention.

What is claimed is:

1. A green sheet holding apparatus, comprising:
   a first member secured to a first edge of the green sheet;
   a second member moveable relative to the first member, the second member being secured to a second edge of the green sheet; and
   a forcing mechanism connected to the second member and the first member, the forcing mechanism forcing the second member away from the first member such that the first edge and the second edge of the green sheet are forced away from each other and the green sheet is flattened.

2. The apparatus of claim 1, wherein the forcing mechanism includes a housing connected to the first member and the second member.

3. The apparatus of claim 2, wherein the forcing mechanism further includes a lever arm connecting the housing to the second member, the lever arm forcing the second member relative to the housing.

4. The apparatus of claim 3, wherein the first member is secured to the housing.

5. The apparatus of claim 2, wherein the forcing mechanism further includes a cam member having a cam surface, the cam member rotatably connected to the housing, and the cam surface connected to the second member such that rotation of the cam member forces the second member away from the first member.

6. The apparatus of claim 2, wherein the apparatus defines an aperture between the first member and the second member, and wherein the green sheet spans the aperture, such that the apparatus does not touch a central portion of the green sheet.

7. The apparatus of claim 1, wherein the green sheet includes a third edge and an opposing fourth edge, the apparatus further including a third member, and a fourth member moveable relative to the third member, wherein the third member is secured to the third edge and the fourth member is secured to the fourth edge, and wherein the forcing mechanism is connected to the fourth member and the third member, the forcing mechanism forcing the fourth member away from the third member, such that the third edge and the fourth edge of the green sheet are forced away from each other and the green sheet is further flattened.

8. The apparatus of claim 1, wherein the first member includes a porous surface, and a first side of the first edge of the green sheet is in contact with the porous surface, the porous surface being fluidly connected to a vacuum source, thereby creating a pressure differential between the first side of the first edge of the green sheet and an opposing second side of the first edge of the green sheet, such that the pressure differential secures the first edge of the green sheet to the first member.

9. The apparatus of claim 1, wherein the second member includes a porous surface, and a first side of the second edge of the green sheet is in contact with the porous surface, the porous surface being fluidly connected to a vacuum source, thereby creating a pressure differential between the first side of the second edge of the green sheet and an opposing second side of the second edge of the green sheet, such that the pressure differential secures the second edge of the green sheet to the second member.

10. The apparatus of claim 1, wherein a tension is created within the green sheet by the first edge and the second edge of the green sheet being forced away from each other, and wherein the tension is from about 2.3 mega-Pascals to about 3.5 mega-Pascals.

11. The apparatus of claim 10, wherein the tension is about 3.3 mega-Pascals.

12. The apparatus of claim 1, wherein the green sheet is substantially horizontal, the apparatus further including at least one nozzle beneath the green sheet, the nozzle being fluidly connectable to a pressurized fluid source, and the apparatus further including a vent whereby fluid from the pressurized fluid source may exit the apparatus, such that fluid flow beneath the green sheet supports a central portion of the green sheet.

13. The apparatus of claim 1 included in a green sheet inspection system, wherein the inspection system further includes a light source directing a light onto the green sheet and a camera detecting light from the green sheet.

14. A sheet holding apparatus, comprising:
   a first member having a first porous surface for supporting a first edge of the sheet, the first porous surface being fluidly connected to a vacuum source;
   a second member moveable relative to the first member, the second member having a second porous surface for supporting a second edge of the sheet, the second porous surface being fluidly connected to a vacuum source;

a third member having a third porous surface for supporting a third edge of the sheet, the third porous surface being fluidly connected to a vacuum source;

a fourth member moveable relative to the third member, the fourth member having a fourth porous surface for supporting a fourth edge of the sheet, the fourth porous surface being fluidly connected to a vacuum source; and a forcing mechanism including a housing, the housing attached to the first member, the second member, the third member, and the fourth member, the forcing mechanism being capable of forcing the second member away from the first member, and the forcing mechanism being capable of forcing the fourth member away from the third member, whereby the green sheet is flattened.

15. The apparatus of claim 14, wherein the housing defines an aperture, wherein the first securing member and the second securing member are attached to opposing sides of the aperture, and wherein the third securing member and the fourth securing member are attached to opposing sides of the aperture.

16. The apparatus of claim 14, wherein the first member and the third member are secured to the housing, and wherein the forcing mechanism forces the second member relative to the housing and away from the first member, and wherein the forcing mechanism forces the fourth member relative to the housing and away from the third member.

17. The apparatus of claim 14, wherein the forcing mechanism includes a first lever arm connected to the second member and connected to the housing and a second lever arm connected to the fourth member and connected to the housing, the first lever arm forcing the second member relative to the housing, and the second lever arm forcing the fourth member relative to the housing.

18. The apparatus of claim 17, wherein the forcing mechanism further includes a cam member having a cam surface, the cam member rotatably connected to the housing, and the cam surface connected to the first lever arm such that rotation of the cam member rotates the first lever arm and thereby forces the second member away from the first member.

19. The apparatus of claim 18, wherein the cam surface is connected to the second lever arm such that rotation of the cam member rotates the second lever arm and thereby forces the fourth member away from the third member.

20. The apparatus of claim 14, wherein the first member is a bar extending along the first edge of the sheet, the second member is a bar extending along the second edge of the sheet, the third member is a bar extending along the third edge of the sheet, and the fourth member is a bar extending along the fourth edge of the sheet.

21. The apparatus of claim 14, wherein the first porous surface, the second porous surface, the third porous surface, and the fourth porous surface lie substantially within a horizontal plane, and wherein the apparatus further includes at least one nozzle beneath the sheet, the nozzle being fluidly connectable to a pressurized fluid source, and the apparatus further including a vent whereby the fluid from the pressurized fluid source may exit the apparatus.

22. The apparatus of claim 14 included in a green sheet inspection system, wherein the inspection system further includes a light source directing a light onto the green sheet and a camera detecting light from the green sheet.

23. A method of holding a screened green sheet, comprising the steps of:

providing a screened green sheet having a first edge and an opposing second edge;

securing the first edge to a first member;

securing the second edge to a second member; and applying a force to the second member, such that the second member is forced away from the first member and such that the first edge and the second edge are pulled outwardly, thereby flattening the green sheet.

24. The method of claim 23, wherein the step of applying a force creates a tension in the green sheet that is from about 2.3 mega-Pascals to about 3.5 mega-Pascals.

25. The method of claim 24, wherein the tension in the green sheet is about 3.3 mega-Pascals.

26. The method of claim 23, wherein the step of securing the first edge to a first member includes fluidly connecting a porous surface of the first member to a vacuum source and bringing the first edge of the green sheet into contact with the porous surface.

27. The method of claim 23, wherein the step of securing the second edge to a second member includes fluidly connecting a porous surface of the second member to a vacuum source and bringing the second edge of the green sheet into contact with the porous surface.

28. The method of claim 23, wherein the step of applying a force to the first member includes rotating a cam member, such that a camming surface on the cam member engages a lever arm and the lever arm engages the first member, thereby applying a force to the first member.

29. The method of claim 23, wherein the green sheet further includes a third edge and an opposing fourth edge, and wherein the method further includes the steps of securing the third edge to a third member and securing the fourth edge to a fourth member after the step of securing the second edge; and wherein the method further includes the steps of applying a force to the fourth member after the step of applying a force to the second member, such that the fourth member is forced away from the third member and such that the third edge and the fourth edge are pulled outwardly, thereby flattening the green sheet.

30. The method of claim 23, further comprising, after the step of providing a green sheet, the steps of resting the first edge of the green sheet on the first member; resting the second edge of the green sheet on the second member; and directing fluid flow beneath the green sheet to support the green sheet and reducing sagging between the first edge and the second edge of the green sheet.

31. A method of inspecting a screened pattern on a green sheet, comprising:

providing a green sheet having a first edge and an opposing second edge, a third edge and an opposing fourth edge, and a first side and an opposing second side, the green sheet having a pattern screened thereon; and securing the first edge to a first member;

securing the third edge to a third member;

securing the second edge to a second member;

securing the fourth edge to a fourth member;

applying a force to the second member, such that the second member is forced away from the first member and such that the first edge and the second edge are pulled away from each other, thereby flattening the green sheet;

applying a force to the fourth member, such that the fourth member is forced away from the third member, and such that the third edge and the fourth edge are pulled away from each other, thereby flattening the green sheet;

directing a light onto the green sheet; and detecting the light as it emerges or is reflected from the green sheet.

32. The method of claim 31, further comprising the steps of resting the first edge of the green sheet on the first member; resting the second edge of the green sheet on the second member; resting the third edge of the green sheet on the third member; resting the fourth edge of the green sheet on the fourth member; and directing a stream of fluid beneath the green sheet to support the green sheet and reduce sagging between the first edge and the second edge, and between the third edge and the fourth edge of the green sheet after the step of providing a green sheet.

33. The method of claim 31, wherein the step of applying a force to the second member creates a tension in the green sheet that is from about 2.3 mega-Pascals to about 3.5 mega-Pascals, and wherein the step of applying a force to the fourth member creates a tension in the green sheet that is from about 2.3 mega-Pascals to about 3.5 mega-Pascals.

34. The method of claim 33, wherein the tension created by the step of applying a force to the second member is about 3.3 mega-Pascals, and wherein the tension created by the step of applying a force to the fourth member is about 3.3 mega-Pascals.

35. The method of claim 31, wherein the step of securing the first edge to a first member includes fluidly connecting a porous surface of the first member to a vacuum source and bringing the first edge of the green sheet into contact with the porous surface of the first member, wherein the step of securing the second edge to a second member includes fluidly connecting a porous surface of the second member to a vacuum source and bringing the second edge of the green sheet into contact with the porous surface of the second member, wherein the step of securing the third edge to a third member includes fluidly connecting a porous surface of the third member to a vacuum source and bringing the third edge of the green sheet into contact with the porous surface of the third member, and wherein the step of securing the fourth edge to a fourth member includes fluidly connecting a porous surface of the fourth member to a vacuum source and bringing the fourth edge of the green sheet into contact with the porous surface of the fourth member.

36. The method of claim 31, wherein the step of applying a force to the first member includes rotating a cam member, such that a camming surface on the cam member engages a first lever arm and the lever arm engages the first member, thereby applying a force to the first member.

37. The method of claim 36, wherein the step of applying a force to the fourth member includes rotating the cam member, such that the camming surface on the cam member engages a second lever arm, thereby applying a force to the fourth member.

* * * * *